United States Patent [19]
Marsh

[11] 3,923,514
[45] Dec. 2, 1975

[54] METHOD FOR THE PREPARATION OF RELIEF PRINTING MASTERS

[75] Inventor: Dana G. Marsh, Rochester, N.Y.

[73] Assignee: Xerox Corporation, Stamford, Conn.

[22] Filed: June 27, 1974

[21] Appl. No.: 483,869

[52] U.S. Cl. .................... 96/35; 96/35.1; 96/115 R; 204/159.21; 96/36.3
[51] Int. Cl.$^2$ .................... G03C 5/00; G03C 1/68
[58] Field of Search ...... 96/27, 35, 35.1, 36, 115 R; 204/159.22, 159.21

[56] References Cited

UNITED STATES PATENTS

| | | | |
|---|---|---|---|
| 2,892,712 | 6/1959 | Plambeck, Jr. | 96/36.3 |
| 3,558,311 | 1/1971 | Delzenne et al. | 96/36.3 |
| 3,779,778 | 12/1973 | Smith et al. | 96/115 R |

*Primary Examiner*—Roland E. Martin, Jr.
*Assistant Examiner*—J. P. Brammer
*Attorney, Agent, or Firm*—James J. Ralabate; James P. O'Sullivan; Jerome L. Jeffers

[57] ABSTRACT

Disclosed is a process for the preparation of relief printing masters. The method involves exposing to activating radiation in an imagewise manner a printing plate comprising a substrate having a film on its surface comprising:

a. a degradable polymer containing segments characterized by the formula:

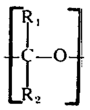

wherein $R_1$ is hydrogen or methyl and $R_2$ is hydrogen, an alkyl radical of 1 to 6 carbon atoms, a chlorinated or fluorinated aliphatic radical of 1 to 6 carbon atoms or a cyano substituted radical of 1 to 5 carbon atoms provided that when $R_1$ is methyl, $R_2$ is also methyl, and b. a photo-oxidant which upon activation is capable of abstracting one or more electrons from one or more of the oxygen atoms in said polymer.

10 Claims, No Drawings

METHOD FOR THE PREPARATION OF RELIEF PRINTING MASTERS

BACKGROUND OF THE INVENTION

Processes for preparing relief images which embody photodegradation of a synthetic organic material are known. For example, it is disclosed in U.S. Pat. No. 2,892,712 (Example VII) that a film of formaldehyde polymer coated with a thin layer of omega, omega-dibromoacetophenone was irradiated with ultraviolet light and baked at 105°C. to provide a sheet having a letter text incised into the surface of the film. This system, which relies upon the ability of the dibromoacetophenone to release Br· radicals which abstract hydrogen atoms from the polymer backbone, could not be used with polyaldehydes other than the difficulty degraded poly(formaldehyde) since the dibromoacetophenone's great reactivity would cause degradation in the dark at normal temperatures. Only by maintaining such a composition at considerably below room temperature could premature degradation be avoided with the use of this sensitizer. In addition, systems for degrading polyaldehydes via a hydrogen abstraction process employ a free radical process and are limited to random scissions with quantum efficiencies ≤ 35. The present photo-oxidant process is ionic and depolymerization to monomer occurs with higher quantum efficiency.

It would be desirable, and it is an object of the present invention, to provide a novel method for the preparation of relief printing masters.

A further object is to provide such a method which relies on the ability of polyether compounds, e.g., poly(acetaldehyde) in admixture with a photo-oxidant to degrade upon exposure to activating radiation.

An additional object is to provide such a process in which the printing master is prepared by irradiating a film of the polyether compound and photosensitizer which film can be stored at ordinary temperatures without substantial degradation prior to exposure.

SUMMARY OF THE INVENTION

The present invention is a process for the preparation of relief printing masters. The method comprises exposing to activating radiation in an imagewise manner a printing plate comprising a substrate having on its surface a film consisting essentially of a degradable polymer in admixture with a photo-oxidant.

DETAILED DESCRIPTION

Polymers which can be used in the present invention include those compositions which are prepared by the polymerization of aldehydes to give polymers which correspond to the formula previously set out.

When aldehydes which contain alkyl groups of 1 to 6 carbon atoms attached to the carbonyl carbon atoms are polymerized, polymers result in which the $R_2$ moiety corresponds to the alkyl group of the aldehyde. Examples of aldehydes which contain such moieties include acetaldehyde, propionaldehyde, n-butyraldehyde, isobutyraldehyde, valeraldehyde and heptaldehyde.

Alternatively, the aldehyde mat contain a chlorinated or fluorinated hydrocarbon radical of from 1 to 6 carbon atoms to provide a polyaldehyde in which the R moiety corresponds to the group attached to the carbonyl carbon of the aldehyde. Examples of such aldehydes include chloroacetaldehyde, dichloroacetaldehyde, chloropropionaldehyde, chlorobutyraldehyde, chloropentaldehyde, chlorovaleraldehyde, chloroheptaldehyde, trifluoroacetaldehyde, trifluoropropionaldehyde, heptafluorobutyraldehyde, chlorodifluoroacetaldehyde and fluoroheptaldehyde.

In addition, aldehydes which contain cyano substituted hydrocarbon radicals containing from 1 to 5 atoms attached to the carbonyl carbon atoms can be polymerized to form degradable polymers useful in the process of the present invention. Examples of these aldehydes include cyanoacetaldehyde, betacyanopropionaldehyde, cyanopentaldehyde and cyanovaleraldehyde.

While ketones are not normally thought of as being polymerizable, poly(acetone) has been reported in the literature by V. A. Kargin, et al. in Dokl. Akad. Navk. SSSR, 134, 1098 (1960), and can be degraded by the action of photoxidants in a manner similar to polyaldehydes. Thus, polymers corresponding to the foregoing formula in which both $R_1$ and $R_2$ are methyl may be used. Such would not be the case in systems in which the polymer is degraded by a hydrogen abstraction process since the abstracted hydrogen must be directly on the polymer backbone.

When homopolymers of the above-described carbonyl compounds are used, the degradable polymer can be represented by the formula:

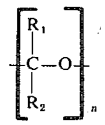

wherein $R_1$ and $R_2$ are as defined above and n is a number representing the degree of polymerization. The degree of polymerization of the homopolymer, i.e., $n$, must be sufficiently great to provide a non-tacky film when the polymer is cast upon a substrate. The maximum degree of polymerization is not critical and may be as high as the realities of polymerization of the carbonyl compound permit. In general, those polyether compounds characterized by the foregoing formula in which $n$ is a number within the range of from 20 to 20,000 are preferred for use in the present invention.

In addition to homopolymers of the above-described carbonyl compounds, copolymers and block copolymers containing degradable segments characterized by the foregoing formula can be employed. For example, copolymers and block copolymers may be prepared from one or more of the carbonyl compounds previously described and other polymerizable constituents such as styrene, isoprene, α-methylstyrene, methylmethacrylate, phenyl isocyanate and ethyl isocyanate. In addition, the degradable segments may occur as side chains appended from the backbone of another polymer.

The degradable polymer is combined with a photosensitizer which is capable upon exposure to activating radiation of abstracting an electron from one or more of the oxygen atoms in the polymer backbone. Suitable photo-oxidants include aromatic carbonyl compounds, e.g., 2-acetonaphthone, fluorenone, xanthone, perfluorobenzophenone, N-methyl acridone, benzophenone and benzophenone derivatives such as Michler's ketone, naphthophenone and benzil; pyrylium salts, e.g., 2,4,6-triphenyl pyrylium tetrafluoroborate and 2,4,6-tritolylpyrylium tetrafluoroborate; anthracene and derivatives, e.g., 9,10-dycyanoanthracene; diazonium salts, e.g., diethylaminobenzene diazonium tetrafluoroborate; diethylaminobenzene diazonium zinc chloride; para quinoid compounds, e.g., anthraquinones, 2-t-butylanthraquinone, phenanthraquinones, dicyanodichloro-p-benzoquinone and p-benzoquinone; unsaturated anhydrides, e.g., maleic anhydride, chloromaleic anhydride and pyromelletic dianhydride; bipyridylium salts, e.g., 1,1'-dimethyl-4,4'-bipyridylium dichloride; tosylate salts, e.g., tetraethylammonium-p-toluene sulfonate and diaza heterocyclic compounds, e.g., pyridazine; 9,10-diazaphenanthrene; 1,2-diazanaphthalene; 5,10-diazaanthracene; 1,2:3,4:6,7-tribenzophenazine; 1,4 diazanaphthalene and 5,6:7,8-dibenzoquinoxaline.

In addition certain dyes and colorants listed in the *Colour Index*, vol. 4 and 5 of The Society of Dyers and Colourists American Association of Chemists and Colorists may be used as the photo-oxidant. Exemplary of these materials are hydroxy phthaleins, e.g. Rose Bengal, Phloxine, Phloxine B, Erythrosin B, Erythosine, Fluorescein, Eosine and Dibromoeosine; Acridines, e.g. Acriflavin and Acridine Orange R; Thiazines, e.g. Methylene Blue; Rhodamines, e.g. Rhodamine B and Rhodamine 6G; Monoazo dyes, e.g. Methyl Orange and Triarylmethane dyes (diamino and triamino derivatives), e.g. Brilliant Green and Methyl Violet.

In addition, natural organic sensitizers such as chlorophyl, rboflavin and hematoporphrins may be used in the present invention.

The printing plates of the present invention are prepared by mixing the degradable polymer and photo-oxidant in a suitable solvent and applying the so-formed solution to a suitable substrate. The amount of oxidant used may vary widely provided that at least an effective amount is employed. An effective amount, as used herein, is defined as that amount of photo-oxidant which will cause the rate of degradation of the polymer to increase to a noticeable extent over the rate at which the polymer containing no photoxidant will degrade. The maximum amount will normally be determined by the compatibility of the polymer and the photo-oxidant since at very high levels excess photoxidant will tend to crystallize out. In general, the photosensitizer will account for from 0.01 to 10 weight percent of the polymer with an amount of from 0.5 to 1.0 weight percent being preferred.

Suitable solvents for use in preparing films of the polymer/photo-oxidant include those organic compositions which will dissolve both constituents and are sufficiently volatile to be readily evaporated from the solutes. Solvents which may be used include tetrahydrofuran, benzene, toluene, acetone, chloroform and chlorobenzene. The solution containing the polymer and photo-oxidant is applied to the substrate such as by spraying, drawing, spinning or dip coating and the solvent evaporated to leave a continuous film of the polymer having the photo-oxidant dispersed therein on the substrate.

The substrate can be of any substance having sufficient rigidity to support the film. Preferably, the substrate is made of a material and has a thickness which will provide a flexible printing plate having sufficient durability to stand up to the rigors encountered during the printing process. Thus, sheets of metals such as aluminum, zinc, stainless steel and brass having thicknesses of from about 4 to 10 mils provide ideal substrates.

After evaporation of the solvent, the printing plate which comprises the substrate having a film of the polymer/photo-oxidant on its surface is ready for imaging. This is accomplished by exposing the plate to activating radiation in an imagewise manner such as through a stencil or photographic negative or positive. As used herein, activating radiation is intended to refer to electromagnetic radiation of a wavelength which will excite the photo-oxidant from the ground state to its excited state. The wavelength of radiation which will cause such excitation will vary with the photo-oxidant being used. In general, photo-oxidants useful in the present invention are activated by electromagnetic radiation in the ultraviolet, near ultraviolet or visible regions of the spectrum.

It has been observed that upon irradiation the exposed areas of the film become soft and tacky and that depressions appear on the film surface. In some instances, these depressions will protrude all the way to the substrate without further treatment. In cases where the depressions project only partially through the film, heating of the plate will vaporize any remaining degradation product and thereby cause the depressions to project through to the substrate.

The exposure time necessary for sufficient polymer degradation will vary depending upon the relative concentrations of degradable polymer and photoxident in the film, the intensity and wavelength of the activating radiation, the thickness of the film and properties of the substrate. Thus, the optimum exposure time for a given plate in order to achieve the desired amount of degradation may require some routine experimentation, but would in no way require the application of inventive skill. Typically, a period of exposure between 10 and 600 seconds will be sufficient for purposes of practicing the invention although longer and shorter exposure times may be appropriate in some instances.

While the present invention is not predicated upon any particular theory or mechanism of operation, it is believed that the following explanation wherein the degradable polymer is poly(acetaldehyde) and the photo-oxidant is designated as P accounts for the observed phenomena.

1. Irradiation with activating radiation leads to an excited state of the photo-oxidant. $P \xrightarrow{h\nu} P^*$ 2. An oxonium ion is formed via electron transfer.

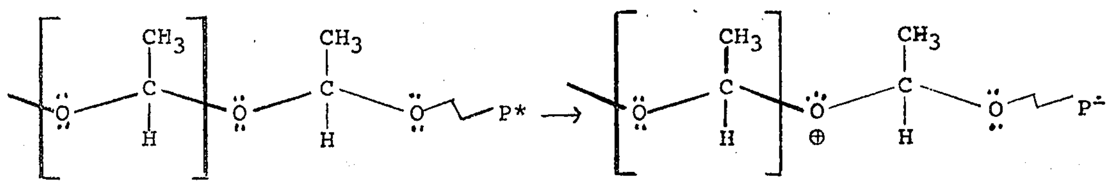

3. Electron shift and chain cleavage converts the oxonium ion into a carbonium ion and an oxy radical.

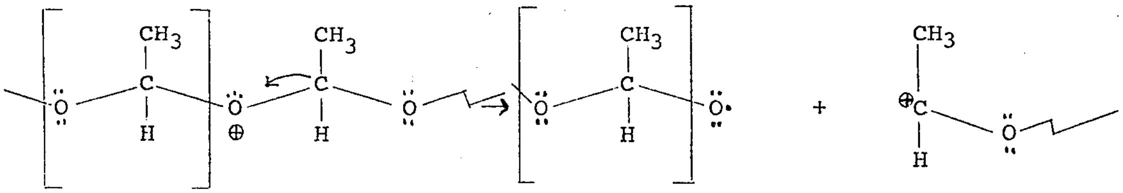

4. The carbonium ion undergoes degradation.

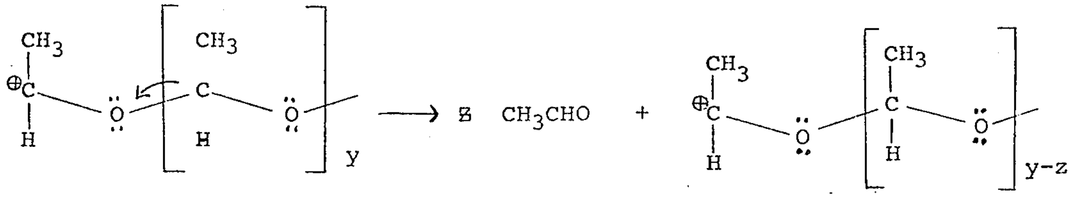

The oxy radical formed may have several fates. A radical abstraction reaction may occur leading to a hemiacetal end-capped polymer fragment and a radical fragment. The end-capped fragment is relatively stable and no further depolymerization will occur. The radical fragment may be involved in an electron transfer to ground state photoxidant leading to further depolymerization.

At this point, i.e. after irradiation, the plate may be used as a relief printing master. In some instances, it may be desirable to heat the plate up to a temperature not exceeding its softening point in order to deepen the depressions in the irradiated areas. In use, the imaged plate is inked and contacted with the surface to be imprinted as are relief printing masters known in the art. It should be noted, however, that the ink selected must be a non-solvent for the polymer film lest the film be damaged by the ink.

The invention is further illustrated by the following examples in which all parts and percentages are by weight.

EXAMPLE I

A thin film consisting of 10 parts poly(acetaldehyde) having a molecular weight of approximately 500,000 and 1 part of maleic anhydride in a 5% (by weight of solids) benzene solution is cast onto a pyrex slide. Upon evaporation of the solvent, the film is exposed through a stencil.

The exposure is accomplished through the use of a UVS-12 mineral light emitting light at 254 nm and providing incident light energy of approximately $7.7 \times 10^3$ erg/cm.$^2$-sec.

An exposure of 60 seconds results in the formation of a relief printing master in which the polymer in the light struck areas is removed down to the glass substrate. The plate is inked and used as a printing master thereby transferring ink in the configuration of the non-exposed areas.

EXAMPLE II

A film prepared as in Example I is exposed as previously described for 30 seconds. The exposure is followed by 5 seconds of heating on a hot plate (~120°F.) and a second 15 second exposure followed by 1 second of heating to 120°F. The polymer is removed down to the substrate in the light struck areas. The plate is inked and used as a relief printing master as before.

EXAMPLE III

A film prepared as in Example I is exposed by a source of radiation emitting at greater than 300 nm. No image results from such exposure. From this experiment it is determined that electromagnetic radiation of wavelength greater than 3000 A is not sufficiently energetic to activate maleic anhydride. However, there are available other photo-oxidants which are excitable at wavelengths of 3000 A or greater.

What is claimed is:

1. A method for the preparation of a relief printing master which comprises exposing to activating radiation in an imagewise manner a printing plate which comprises a substrate having on its surface a film of a composition consisting essentially of a. a degradable polymer containing units of the formula:

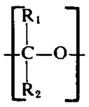

wherein $R_1$ is hydrogen or methyl and $R_2$ is hydrogen, an alkyl radical of 1 to 6 carbon atoms, a chlorinated or fluorinated aliphatic radical of 1 to 6 carbon atoms or a cyano substituted radical of 1 to 5 carbon atoms provided that when $R_1$ is methyl, $R_2$ is also methyl, and b. a photo-oxidant which upon activation is capable of abstracting an electron from one or more of the oxygen atoms in said polymer.

2. The method of claim 1 wherein the degradable polymer is a homopolymer having repeating segments characterized by the foregoing formula and has a degree of polymerization from 20 to 20,000.

3. The method of claim 1 wherein the degradable polymer is poly(acetaldehyde).

4. The method of claim 2 wherein the degradable homopolymer is poly(acetaldehyde) and the photo-oxidant is maleic anhydride.

5. The method of claim 1 wherein $R_1$ and $R_2$ are methyl.

6. The method of claim 1 wherein the photo-oxidant is present in an amount of from 0.01 to 10 weight percent of the degradable polymer.

7. The method of claim 6 wherein the amount of photo-oxidant is from 0.5 to 1.0 weight percent.

8. The method of claim 1 wherein the activating radiation is in the ultraviolet, near ultraviolet or visible region of the electromagnetic spectrum.

9. The method of claim 1 wherein the film is heated after exposure.

10. The method of claim 1 wherein the photo-oxidant is an aromatic carbonyl compound, a pyrylium salt, anthracene or a derivative thereof, a diazonium salt, a para quinoid compound, an unsaturated anhydride, a tosylate salt, a diaza heterocyclic compound or a mixture thereof.

* * * * *

UNITED STATES PATENT AND TRADEMARK OFFICE

CERTIFICATE OF CORRECTION

PATENT NO. : 3,923,514

DATED : December 2, 1975

INVENTOR(S) : Dana G. Marsh

It is certified that error appears in the above-identified patent and that said Letters Patent are hereby corrected as shown below:

1. In the Abstract, line 5, delete "comprising" and insert --consisting essentially of--.

2. Column 1, line 64, delete "mat" and insert --may--.

Signed and Sealed this

*thirtieth* Day of *March 1976*

[SEAL]

*Attest:*

RUTH C. MASON
*Attesting Officer*

C. MARSHALL DANN
*Commissioner of Patents and Trademarks*